(12) United States Patent
Paulson et al.

(10) Patent No.: US 7,126,368 B2
(45) Date of Patent: Oct. 24, 2006

(54) SYSTEM AND METHOD FOR DETECTING MOTOR COIL-TO-COIL FAULTS

(75) Inventors: John David Paulson, West Fargo, ND (US); Brian Frederick Boeshans, Fargo, ND (US); Jeffrey Gerald Hopman, Horace, ND (US); Robert Boyd Shaw, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 10/942,269

(22) Filed: Sep. 16, 2004

(65) Prior Publication Data

US 2006/0055419 A1    Mar. 16, 2006

(51) Int. Cl.
*G01R 31/34* (2006.01)
(52) U.S. Cl. .................. 324/772; 324/545; 324/546
(58) Field of Classification Search .............. 324/772, 324/338, 545–547, 143
See application file for complete search history.

(56) References Cited

U.S. PATENT DOCUMENTS

| | | | |
|---|---|---|---|
| 4,286,303 A | | 8/1981 | Genheimer et al. ............ 361/24 |
| 4,541,029 A | | 9/1985 | Ohyama ...................... 361/31 |
| 5,081,404 A | | 1/1992 | Kelley et al. ................ 318/434 |
| 5,471,135 A | * | 11/1995 | Jagger et al. ............. 324/158.1 |
| 5,569,966 A | * | 10/1996 | Schantz et al. ............. 307/10.1 |
| 5,652,525 A | * | 7/1997 | Mullin et al. ................ 324/772 |
| 5,969,919 A | | 10/1999 | Kobayashi et al. ........... 361/23 |
| 6,020,695 A | * | 2/2000 | Kelly et al. .................... 318/49 |
| 6,042,513 A | | 3/2000 | Koteles et al. ................ 482/54 |
| 6,291,987 B1 | * | 9/2001 | Dean et al. .............. 324/158.1 |
| 6,335,631 B1 | * | 1/2002 | Kliman et al. .............. 324/772 |
| 6,381,110 B1 | | 4/2002 | Nagashima et al. .......... 361/23 |
| 6,486,626 B1 | * | 11/2002 | Pugh .......................... 318/139 |
| 6,529,135 B1 | | 3/2003 | Bowers et al. .............. 340/648 |
| 6,590,362 B1 | | 7/2003 | Parlos et al. ................. 318/799 |
| 6,611,771 B1 | | 8/2003 | Habetler et al. .............. 702/58 |
| 6,628,485 B1 | * | 9/2003 | Rajala et al. ................. 361/31 |
| 6,720,749 B1 | * | 4/2004 | Ta et al. ...................... 318/434 |
| 6,784,687 B1 | * | 8/2004 | Tamura ....................... 324/772 |

OTHER PUBLICATIONS

BJM Corporation, All-Test III™ Motor, Coil and Winding Tester, 2 pages, date unknown.

* cited by examiner

*Primary Examiner*—Anjan Deb
*Assistant Examiner*—Marina Kramskaya

(57) ABSTRACT

A system and method detects coil-to-coil faults in an electric motor having a plurality of coils. The method includes applying a square wave signal to a first coil of the motor, connecting a capacitor and a resistor between ground potential and a second coil of the motor, applying the coil output voltage to an amplifying and peak detecting circuit, applying an output of the amplifying and peak detecting circuit to the input of the control unit and, after a delay period, generating a motor fault signal if the coil output voltage is below a predetermined threshold. The square wave signal is amplified by a circuit which prevents transmission of voltage signals from the coils to the output of the control unit during normal operation of the motor.

12 Claims, 2 Drawing Sheets

SYSTEM AND METHOD FOR DETECTING MOTOR COIL-TO-COIL FAULTS

BACKGROUND

The present invention relates to a system and method for detecting faults in an electric motor.

Small, low cost electric motors and controllers are used in certain product applications, such as electric reel drives on greens mowers which includes a 3-phase permanent magnet brushless DC electric motor. The motor controller typically includes high power FETs which can be damaged by overheating or overcurrents. It is difficult to detect when such a motor fails, and when a system with such a failed motor is not working, a repair technician may attempt to repair the system by replacing the controller instead of the faulty motor. But, if the motor was faulty, it may merely damage the new controller. Thus, it is desired to have a means for detecting motor faults before the faulty motor can damage a controller.

Typically, systems for detecting faults in such motors have been complicated and have required expensive circuitry. U.S. Pat. No. 6,381,110, issued to Nagashima et al. in 2002, describes a system for detecting isolation or coil-to-case faults of a motor. However, this system cannot detect inductance degradation or phase coil-to-phase coil short circuit faults.

SUMMARY

Accordingly, an object of this invention is to provide a simple and inexpensive system for detecting faults in an electric motor.

Another object of this invention is to provide a system for detecting phase coil-to-phase coil faults in an electric motor.

Another object of this invention is to provide a system for detecting faults in an electric motor before the faulty motor can damage a controller.

These and other objects are achieved by the present invention, wherein a system and method, upon start-up, detects coil-to-coil faults in an electric motor having a plurality of coils. The method includes applying a square wave signal to a first coil of the motor, connecting a second coil to ground, connecting a capacitor and a resistor between ground potential and a third coil of the motor, applying the third coil output voltage to an amplifying and peak detecting circuit, applying an output of the amplifying and peak detecting circuit to the input of the control unit and, after a delay period, generating a motor fault signal if the output of the amplifying and peak detecting circuit is below a predetermined threshold. The square wave signal is amplified by a circuit which prevents transmission of voltage signals from the coils to the output of the control unit during normal operation of the motor.

DETAILED DESCRIPTION

Figure 1:
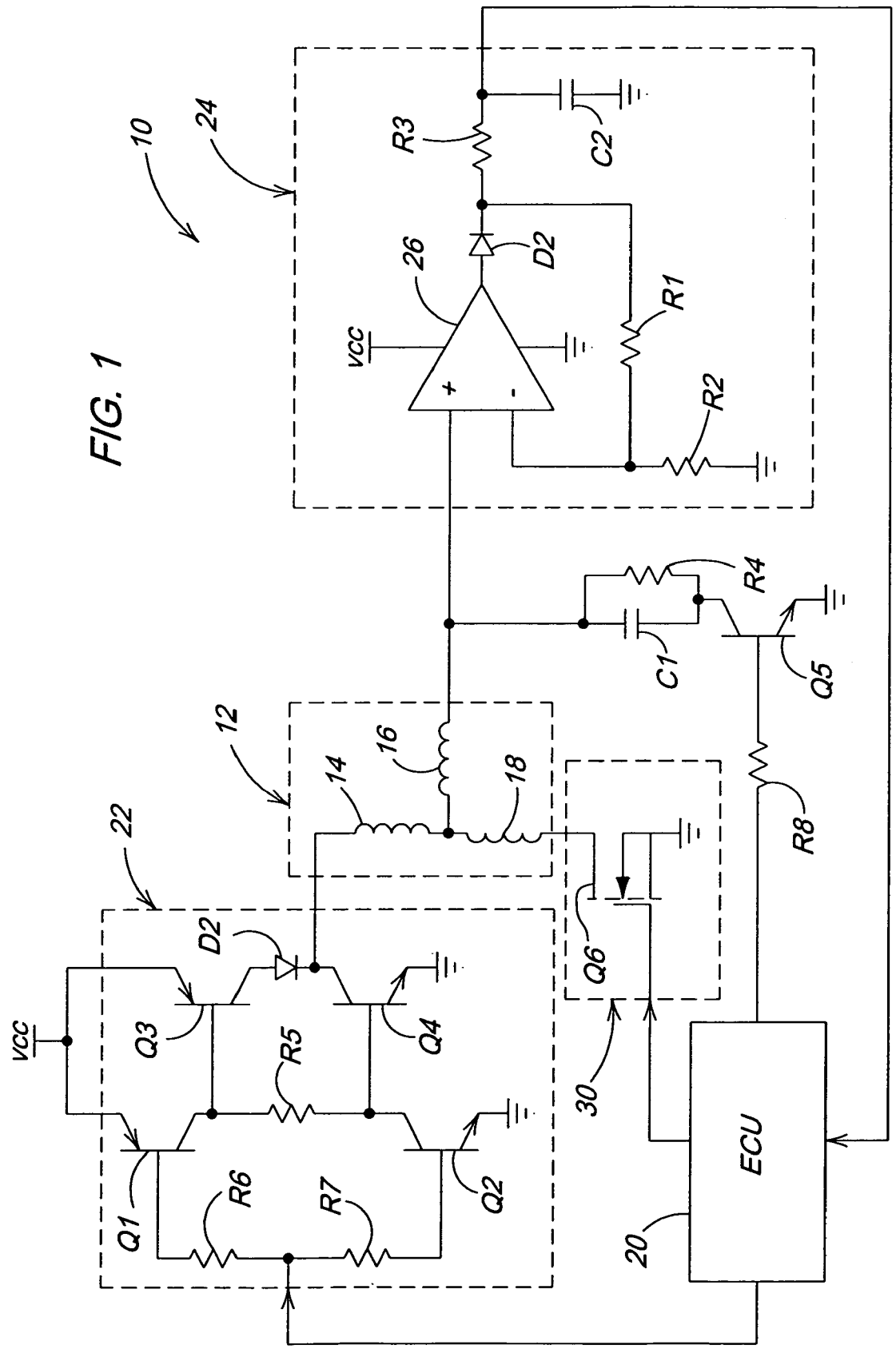
FIG. 1 is a schematic diagram of a motor fault detection system according to the present invention.

Referring to FIG. 1, the motor fault detection system 10 is connected to a conventional 3-phase brushless DC motor 12 which has phase coils 14, 16 and 18. The motor fault detection system 10 includes a microprocessor-based electronic control unit (ECU) 20 which supplies a square wave excitation signal to a driver/current amplifier 22.

Driver/amplifier 22 includes resistors R6 and R7, each connected between the output of ECU 20 and a base of a transistor Q1 and Q2, respectively. The emitter of transistor Q1 is connected to a supply voltage, Vcc, such as +5 volts. The collector of Q1 is connected to the base of transistor Q3 and to the collector of transistor Q2 via resistor R5. The collector of transistor Q2 is also connected to the base of transistor Q4. The emitters of Q2 and Q4 are connected to ground. The emitter of transistor Q3 is connected to a supply voltage, such as +5 volts. The collector of Q3 is connected to the anode of diode D2. The cathode of diode D2 is connected to the collector of transistor Q4. Finally, the collector of transistor Q4 is connected to phase coil 14 of motor 12. Driver/amplifier 22 prevents transmission of voltage signals from the motor 12 to the control unit 20 during normal operation of motor 12.

A novel feature of the design of the driver/amplifier 22 is the inherent prevention of the "shoot-through" condition, where Q3 and Q4 are both conducting causing large currents and damage to Q3 and Q4. This "shoot-through" condition can typically occur during the transition between driving a 0 volt output and a 5 volt output. When the ECU 20 applies a 0 volt input, transistor Q1 is designed to be in saturation and transistor Q2 is off. As the ECU 20 increases the input voltage to the driver 22 from 0 volts to 5 volts, transistor Q2 is designed to be in saturation while Q1 remains in saturation. The current through the collectors of transistors Q1 and Q2 is limited by R5 so no damage occurs. Note that when both transistors Q1 and Q2 are in saturation, transistors Q3 and Q4 will be turned off, thereby adding "dead-time" where neither transistor is on and eliminating the shoot-through condition. As the ECU 20 increases the input voltage to driver 22 to 5 volts, transistor Q1 turns off, allowing transistor Q2 to draw current out of the base of transistor Q3, putting it into saturation.

The other end of coil 14 is connected to an end of coils 16 and 18 in a Y connected motor. The other end of coil 18 is connected to ground via normally open switch 30 which includes transistor Q6 which is preferably part of the inverter (not shown) which supplies electrical power to the coils 14–18. Switch 30 is opened and closed by a signal provided from an output of ECU 20.

The other end of coil 16 is connected to the collector of normally off or open transistor switch Q5 via parallel connected capacitor C1 and resistor R4. The emitter of transistor Q5 is connected to ground and the base of transistor Q5 is connected to a control output of ECU 20 through a resister R8. This other end of coil 16 is also connected to sense peak detector/amplifier circuit 24.

Circuit 24 includes a operational amplifier 26 with a + input connected to coil 16 (and resistor R4 and capacitor C1) and a − input connected to ground via resistor R2. The output of op amp 26 is connected to the anode of diode D2. The cathode of diode D2 is connected the − input of op amp 26 via resistor R1, to an input of ECU 20 via resistor R3 and to ground via resistor R3 and capacitor C2. Circuit 24 amplifies the signal from coil 16 and generates a slowly varying DC output signal, the voltage of which varies as the peak voltage of the signal from coil 16 varies. This output signal is applied to an input of the ECU 20.

Figure 2:
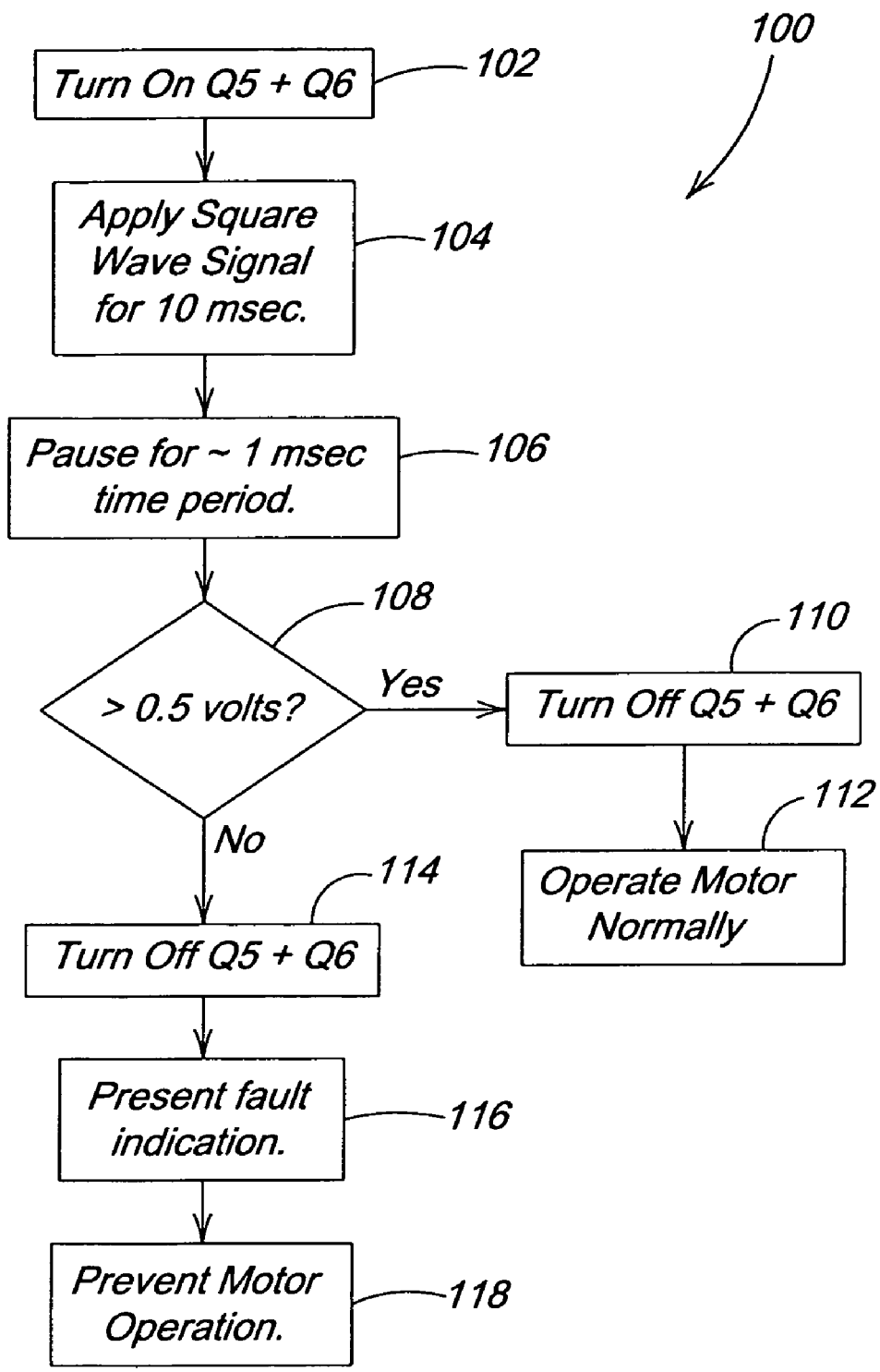
FIG. 2 is logic flow diagram illustrating an algorithm executed by the ECU of FIG. 1.

A microprocessor (not shown) of ECU 20, executes an algorithm 100 represented by FIG. 2. The conversion of the above flow chart into a standard language for implementing the algorithm described by the flow chart in a digital computer or microprocessor, will be evident to one with ordinary skill in the art.

Step 102, in response to a startup signal, turns on transistor switches Q5 and Q6, thereby connecting the output end of coil 16 to ground via resistor R4 and capacitor C1, and connecting an end of coil 18 to ground via Q6.

In step 104 the ECU 20 applies a square wave signal to the input of driver/amplifier 22. Preferably, the square wave has a 7 kHz frequency, a 50% duty cycle, a duration of about 10 milliseconds and voltage levels of zero and 5 volts. The optimum frequency of the square wave excitation signal may be determined based on an empirical and statistical analysis of many motors to characterize their inductance and resistance. These along with the resistor R4 and capacitor C1 determine the resonant frequency of an inductor-capacitor-resistor circuit. Preferably, the frequency of the square wave signal is chosen to be the same as the resonant frequency of this circuit so that a maximum output signal will be generated by a motor with good phase-to-phase inductance. It should be understood that the current amplitude from the driver circuit 22 also affects the perceived inductance in the motor 12 (because of all the magnets, ferrous materials and magnetic field interactions), so testing is preferably done with the circuit planned to be used in the final product.

This square wave signal is amplified by amplifier 22 and is applied to coil 14 of motor 12. Amplifier 22 preferably generates a drive signal with a maximum drive current of 50 milliamps RMS and a drive voltage of between a maximum of 4 volts and a minimum drive of 0 volts. These values are application specific and can vary based on the winding inductance and resistance of the motor.

In response to this drive signal applied to coil 14, coil 16 generates a substantially sinusoidal low voltage signal which is applied to the + input of op amp 26. Meanwhile, step 106 causes the system to pause for a time period (such as about 1 millisecond) sufficient for the response to the drive signal to stabilize the voltage across capacitor C2.

In step 108 the ECU 20 compares the output of amplifier 24 to a threshold voltage, such as 0.5 volts, and if the output of amplifier 24 is greater than the threshold voltage, step 108 directs the algorithm to step 110 which turns off transistors Q5 and Q6, and then to step 112 which ends the test algorithm 100 and allows the motor 12 to be operated normally. If the output of amplifier 24 is not greater than the threshold voltage, then step 108 directs control to step 114 which turns off transistors Q5 and Q6. Then step 116 generates a fault indication signal, such as an audible signal from a speaker (not shown) and/or visible signal from a display device (not shown).

Finally, step 118 prevents further operation of the motor 12. Preferably, steps 102–118 would be applied to each of the motor coils 14–18, one after the other by re-arranging the connections between the driver 22, the peak detector 24 including resister R4 and capacitor C1, the switch 30 and the motor 12.

The result is a simple low cost system and method which detects phase inductance and phase-to-phase faults prior to normal operation of the motor.

While the present invention has been described in conjunction with a specific embodiment, it is understood that many alternatives, modifications and variations will be apparent to those skilled in the art in light of the foregoing description. For example, the same circuitry could be connected to additional motor coils and the same algorithm executed. Also, a number of square wave signals having different frequencies could be applied and the resulting frequency response could be analyzed. Or, the frequency of the square wave could be varied gradually and the output monitored for resonant peaks. The circuit configuration could easily be adapted to the delta connected motor. Accordingly, this invention is intended to embrace all such alternatives, modifications and variations which fall within the spirit and scope of the appended claims.

We claim:

1. A fault detection system for detecting coil-to-coil faults in an electric motor having a plurality of phase coils, the fault detection system comprising:
a driver circuit connected to a first one of the coils and applying a periodic current having a certain frequency to the coil;
a first normally open switch having a first terminal connected to a second one of the coils and having a second terminal connected to a ground potential;
a capacitor and a resistor connected between the second one of the coils and the first terminal of the first switch;
a second normally open switch having a first terminal connected to a third one of the coils and having a second terminal connected to a ground potential; and
a control unit having a first output connected to the first switch, a second output connected to the second switch, a third output connected to the driver circuit, and an input receiving an output signal from the second one of the coils, the control unit closing the switches and causing the driver circuit to apply the periodic current to the first coil, the control unit generating a motor fault signal and preventing normal operation of the motor when the output signal is below a predetermined threshold.

2. The fault detection system of claim 1, wherein:
the driver circuit includes components which prevent transmission of voltage signals from the coils to the output of the control unit during normal operation of the motor.

3. The fault detection system of claim 1, further comprising:
an amplifier and peak detection circuit connected between the second one of the coils and the input of the control unit.

4. The fault detection system of claim 3, wherein: the control unit delays receiving the input from the amplifier and peak detection circuit until a steady-state condition exists.

5. A fault detection system for detecting coil-to-coil faults in an electric motor having a plurality of phase coils, the fault detection system comprising:
a driver circuit connected to a first one of the coils and applying a square wave signal to the coil;
a capacitor and a resistor connected between a second one of the coils and a first switch, the first switch also connected to ground potential;
a second switch connected between ground potential and a third one of the coils;
an amplifier and peak detection circuit connected between the second one of the coils and an input of a control unit; and
the control unit having a first output connected to the first switch, a second output connected to the second switch, a third output connected to the driver circuit, and an input receiving an output signal from the second one of the coils, the control unit closing be the switches and causing the driver circuit to apply a periodic current to the first one of the motor coils, the control unit generating a motor fault signal and preventing normal operation of the motor when the output signal is below a predetermined threshold.

6. The fault detection system of claim 5, wherein:
the control unit delays receiving the output signal from the detector/amplifier circuit until a steady-state condition exists.

7. The fault detection system of claim 5, wherein:
the driver circuit includes components which prevent transmission of voltage signals from the coils to the output of the control unit during normal operation of the motor.

8. The fault detection system of claim 5, wherein:
the switches comprise normally open switches.

9. A method for detecting coil-to-coil faults in an electric motor having a plurality of coils, the fault detection method comprising:
connecting a capacitor and a resistor between a second coil of the motor and a first terminal of a switch, a second terminal of the switch connected to ground potential;
connecting a third coil of the motor to ground potential;
applying a time-varying current having a certain frequency to a first coil of the motor;
monitoring a coil output voltage at the second coil; and
receiving an input of the coil output voltage in a control unit, the control unit generating a motor fault signal if the coil output voltage is below a predetermined threshold.

10. The method of claim 9, further comprising:
preventing transmission of voltage signals from the coils to the control unit during normal operation of the motor.

11. A method for detecting coil-to-coil faults in an electric motor having a plurality of coils, the fault detection method comprising:
applying a time-varying current having a certain frequency to a first coil of the motor;
connecting a capacitor and a resistor between a second coil of the motor and a first terminal of a first switch, a second terminal of the first switch connected to ground potential;
applying an output voltage from the second coil of the motor to an amplifying an peak detecting circuit;
applying an output of the amplifying and peak detecting circuit to an input of a control unit;
generating a motor fault signal if the coil output voltage is below a predetermined threshold; and
preventing transmission of voltage signals from the coils to the control unit during normal operation of the motor.

12. The method of claim 11, further comprising:
delaying output of the amplifying and peak detecting circuit to the input of the control unit until a steady-state condition exists.

\* \* \* \* \*